United States Patent [19]

Aihara et al.

[11] Patent Number: 4,560,404
[45] Date of Patent: Dec. 24, 1985

[54] METHOD OF PRODUCING MATERIAL FOR SUPERCONDUCTOR

[75] Inventors: Katsuzo Aihara, Hitachiohta; Naofumi Tada, Hitachi; Yasuo Suzuki, Takahagi; Joo Ishihara, Hitachi; Toshio Ogawa, Katsuta, all of Japan

[73] Assignee: Hitachi, Ltd., Tokyo, Japan

[21] Appl. No.: 687,914

[22] Filed: Dec. 31, 1984

[30] Foreign Application Priority Data

Dec. 29, 1983 [JP] Japan .................. 58-247686

[51] Int. Cl.$^4$ ............................................. H01L 39/24
[52] U.S. Cl. .................... 75/0.5 C; 29/599; 148/11.5 P; 264/8
[58] Field of Search .................. 75/0.5 C; 29/599; 419/38; 264/6, 8, 13; 148/11.5 F, 11.5 P

[56] References Cited

U.S. PATENT DOCUMENTS

| | | | |
|---|---|---|---|
| 3,290,186 | 12/1966 | Rosi et al. | 29/599 |
| 3,407,049 | 10/1968 | Freeman, Jr. et al. | 29/599 |
| 3,541,680 | 11/1970 | Verrijp | 29/599 |
| 4,050,147 | 9/1977 | Winter et al. | 29/599 |

Primary Examiner—Wayland Stallard
Attorney, Agent, or Firm—Antonelli, Terry & Wands

[57] ABSTRACT

A method of producing a composite material of and Nb or V used for a superconductive wire comprises vacuum - melting two kinds of raw materials, 70 wt % Cu and 30 wt % Nb or V to form a melt; scattering the melt by a rotating disc to form a plurality of fine droplets each of which includes Cu and Nb or V at substantially the same compounding rate as the raw materials; and cooling rapidly the fine droplets by spraying an inert gas onto the scattering droplets thereby providing particulate bodies each of which dendrites of Nb or V are precipitated in Cu. The fine particles are compression - molded to form a molded product. The molded product is sintered to form an ingot in which the dendrites of Nb or V are dispersed homogeneously in the Cu base. The ingot is used for producing a superconductive wire, namely, it is subjected to cold rolling to reduce its sectional area, coating with Su or Ga, and diffusion heat-treating the wire to form Nb$_3$Sn or V$_3$Ga in the Cu base, whereby a superconductive wire is provided in which Nb$_3$Sn or V$_3$Ga are homogeneously dispersed in the Cu base.

9 Claims, 1 Drawing Figure

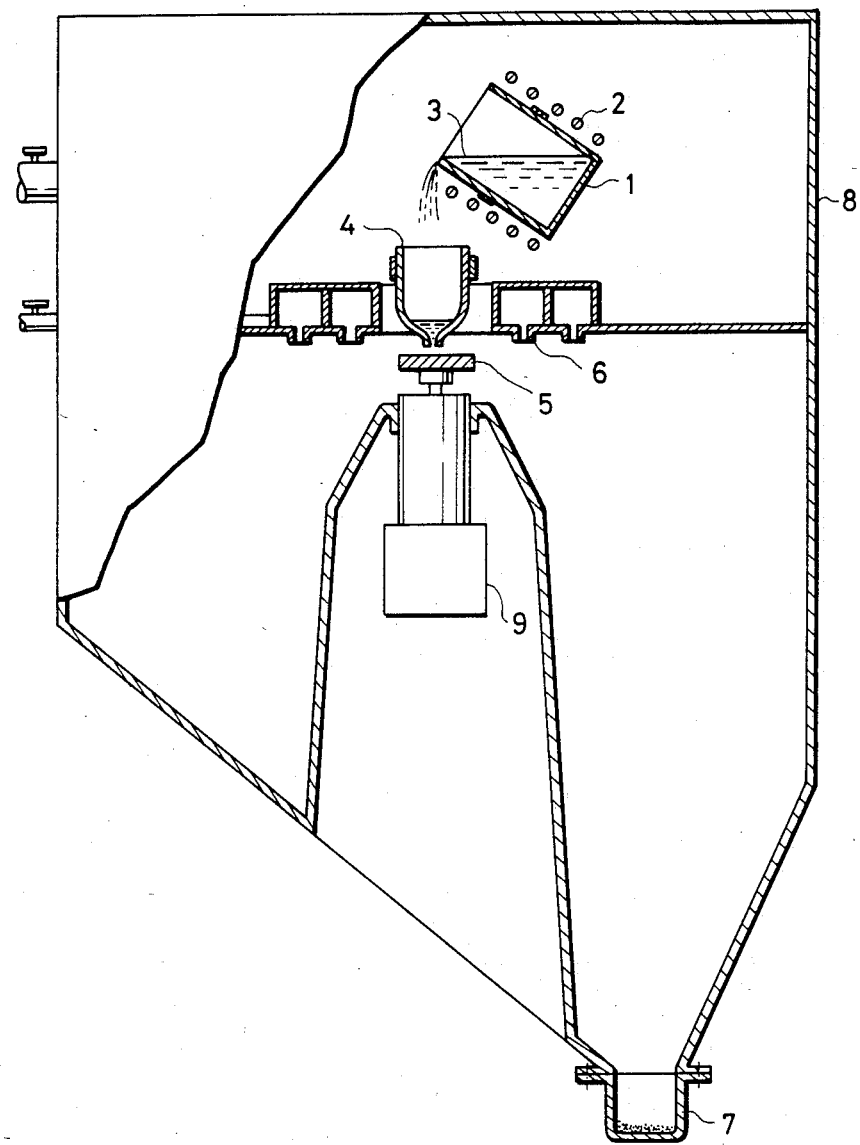

METHOD OF PRODUCING MATERIAL FOR SUPERCONDUCTOR

BACKGROUND OF THE INVENTION

This invention relates to a method of producing a material for superconductor in which Cu and Nb or V are main components, and more particularly to a method of producing a material for superconductor which is extremely homogeneous and ductile.

Since superconductive wires comprising a compound such as $Nb_3Sn$ or $V_3Ga$ have a high critical current density under a high magnetic field, they are used as a wire for a superconductive magnet generating a large magnetic field.

Such a superconductive wire is manufactured mainly by a bronze method. However, the process of this method is complicated, and the superconductive characteristics with respect to strain of wire obtained by this method are extemely low. In recent years, superconductive wire in which discontinuous fibers are formed in a Cu base, a so-called in-situ superconductive wire, is being developed to provide a wire free from these defects. The characteristic of this in-situ superconductive wire resides in that extremely thin $Nb_3Sn$ or $V_3Ga$ filaments are dispersed discontinuously in a Cu alloy.

The basic method of manufacturing wires of this kind will now be described, taking as an example a method of manufacturing $Nb_3Sn$ wires.

A mixture of Cu and Nb is prepared so that it contains 15–50% by weight Nb, and the mixture is melted and cast under vacuum or in an inert gas atmosphere to form a Cu-Nb material for superconductor. The Nb in this Cu-Nb material is substantially not solid-dissolved in the Cu base, the material has a structure in which Nb is precipitated in dendritic precipitates in the Cu. When the Cu-Nb precipitates are then subjected to an area-reduction process to form an elongated wire, the dendritic Nb precipitates are stretched and dispersed in the shape of discontinuous fibers in the basic Cu material. The surface of the elongated wire is then coated with Sn, and is thereafter subjected to a diffusion heat treatment at a temperature of 500°–750° C. which diffuses the Sn into the Cu base group so that it reacts with the Nb to form the compound $Nb_3Sn$ dispersed in a Cu alloy.

However, in this method, the shape and size of the Nb dendritic precipitates in the Cu-Nb material are sensitive to cooling rate during the melting and casting, so that it is difficult to produce an ingot which is highly homogeneous in the longitudinal and diametrical directions thereof. When the Nb dendritic structure in the Cu-Nb material is uneven, the critical current density characteristics of the resultant superconductive wire are uneven in the lengthwise direction thereof.

The surface of the ingot is usually peeled off and the top and bottom thereof are cut off before the ingot is subjected to the area-reduction process, so that the yield is extremely low.

In one method of producing a Cu-Nb material for superconductor, which can solve this problem of the heterogeneous structure of a Cu-Nb material, powdered Cu and Nb are used. This method will now be described.

Cu powder and Nb powder are first mixed, and the resultant mixture is compression-molded and then sintered to obtain a Cu-Nb ingot. This Cu-Nb ingot is subjected to an area-reduction process to form an elongated wire, this wire is coated with Sn and is then subjected to a diffusion heat treatment to provide a $Nb_3Sn$ superconductive wire.

According to this method, if the particle sizes of the raw Cu and Nb powders is regulated suitably, and, if the powders are then mixed by being agitated thoroughly, a substantially homogeneous Cu-Nb material for superconductor can be obtained.

However, the largest drawback encountered in this conventional method resides in that, since Nb is active, the raw Nb powder is easily contaminated with oxygen. Commercially-available, raw Nb powder has a high oxygen concentration of 0.1–0.5% by weight. If this raw Nb powder is mixed as it is with Cu powder, and the resultant mixture is subjected to mold-sintering to obtain an ingot, the area-reduction processability of the ingot is adversely affected as the ingot is stretched into a wire, so that extending the ingot into an elongated wire is difficult. This is thought to be because the Nb particles dispersed in the Cu base are contaminated with oxygen and are thus embrittled. Accordingly, when the ingot is stretched into a wire, the Nb particles are plastically deformed, so that stress concentrations occur in the Nb particles and generate cracks in the ingot. A Cu-Nb material for superconductor in which such oxygen-contaminated Nb particles are dispersed in the Cu base can not provide the resultant superconductor with the desired superconductive characteristics.

Therefore, according to the conventional method, it is necessary to subject the raw powder to a pretreatment such as a reduction treatment. This makes the production process complicated. In addition, in order to obtain a sinter in which Nb particles are dispersed uniformly in the Cu base, it is necessary to mix two different raw powder by thoroughly agitating them. This makes the production process even more complicated.

Further, Japanese Laid-open Patent Publication No. 56-162412 (1981) discloses a method of producing a superconducting wire using Nb particles coated with Cu by vapor or electrical deposition method. This method also needs compricated processes, for example, reduction treatment of the particles, complete mixing of the particles, a deposition process of Cu to the fine particles, etc.

The above is a description of a conventional method of producing superconductive wire, taking as an example a method of producing $Nb_3Sn$ superconductive wire. The method of producing $V_3Ga$ superconductive wire is similar to that of producing the $Nb_3Sn$ superconductive wire.

SUMMARY OF THE INVENTION

An object of the present invention is to provide a method of producing a material for superconductor which contains Cu and Nb or V as main components and which is able to provide a superconductor having excellent superconductive characteristics, the method being capable of preventing oxygen contamination of Nb or V which will be dispersed in the Cu base, and greatly improving the area reduction processability.

The method of producing a material for superconductive material according to the present invention is characterized by the steps of vacuum-melting a raw material, which contains Cu and Nb or V as main components in a predetermined mixing ratio, to form a melt; scattering the melt to form fine droplets; solidifying the droplets rapidly to form integrated particulate bodies containing Cu and Nb or V as main components thereof; compression-molding the integrated particulate bodies to a predetermined shape; and then sintering the compression-molded product.

Especially, the gist of the present invention resides in the fact that a melt prepared by vacuum-melting a raw material containing Cu-Nb or Cu-V as main components at a predetermined ratio is solidified rapidly to form intergral particulate bodies in which Nb or V is dispersed in the Cu base, without being contaminated with oxygen. When the powder consisting of such integrated particulate bodies of Cu-Nb or Cu-V is compression-molded and sintered, a material for superconductor in which Nb or V is uniformly dispersed in the Cu base can be obtained.

BRIEF DESCRIPTION OF THE DRAWING

FIGURE is a sectional view of apparatus used to practice an embodiment of the present invention.

DESCRIPTION OF THE PREFERRED EMBODIMENT

An embodiment of the present invention will be described in detail in its process sequence, with reference to the drawing in which an example of apparatus for practicing the embodiment is illustrated.

Raw materials, Cu and Nb or V are prepared. The shape of the raw material is not specifically limited, it may be in the form of lumps as well as a powder. As for the Nb and V, the lumps such as sheets are preferable because they are active and not easier to be oxidized than the powder.

The raw materials, Cu and Nb or V are mixed in a predetermined ratio. The preferable composition of the raw materials is the same as that in the conventional method of this kind, i.e., the raw materials preferably contain Nb or V in the range of 15-50% by weight with respect to Cu. It is said that adding a few percent of Ti, Ta, Zr, Hf, Al or Mg to the raw material provides a good effect.

The resultant mixture of the raw materials is placed in a melting crucible 1 and melted by a high-frequency heating coil 2 to form a melt 3. In order to melt the raw materials, it is necessary to obtain a temperature of 1400°-1800° C., although this varies with the composition of the raw materials. In particular, in order to prevent the raw material oxidizing, it is preferable to melt the material under a vacuum or in an atmosphere of an inert gas such as Ar, $N_2$ or He, and more preferable under vacuum of about $10^{-5}$ torr.

The melt 3 is scattered to make it into a plurality of fine droplets, as follows:

The melting crucible 1 is tilted so that the melt 3 is dropped through nozzle 4 onto the upper surface of a disc 5 which is rotating at an extremely high speed. The melt dropped onto the disc 5 is scattered by centrifugal force and turns into fine droplets. An amount of the melt dropped onto the disc 5 is controlled well by the nozzle 4 to contribute formation of uniform sized droplets.

The fine droplets or particles are cooled rapidly to solidify them rapidly. During the scattering, cooling gas is supplied from ejection ports 6, and the fine particles are cooled by this cooling gas and solidified, so that integrated particulate bodies are formed. Reference numeral 7 denotes a particulate body recovery port, 8 a vacuum tank, and 9 a disc-rotating motor. The particulate bodies thus formed are spherical. It has been ascertained that the particle size of the particulate bodies decreases in inverse proportion to the temperature of the melt and the rotational speed of the disc 5. For example, the average particle diameter of integrated particulate bodies produced using a raw material consisting of Cu and 30% by weight Nb with a melt temperature of 1650° C. and a rotational disc speed of 25,000 r.p.m. is 75 $\mu$m, and the average particle diameter of similar particulate bodies produced under the same conditions except that the rotational speed of the disc is changed to 10,000 r.p.m. is 135 $\mu$m. When a cross section of a particulate body thus obtained is observed through an optical microscope, it can be understood that fine dendritic precipitates of Nb are dispersed in the basic Cu material. Analysis determining the density of oxygen in the integrated particulate bodies shows that the oxygen content is 50-100 ppm, which is extremely low compared with that in commercially-available Nb powder.

The integrated particulate bodies of Cu-Nb or Cu-V are then compression-molded to a predetermined shape, and the molded product is sintered to obtain an ingot. In these compression-molding and sintering steps, conventional, generally-used methods can be employed. In order to obtain an accurate superconductive material, it is effective to subject the integrated particulate bodies to Hot Isostatic Pressing, the so-called HIP.

Embodiments of the present invention will be further described in more detail by the following Examples.

EXAMPLE 1

700 gr of lumps of oxygen-free Cu and 300 gr of thin Nb plate were placed in a crucible 1 in the apparatus for producing particulate bodies shown in FIG. , and were melted in a vacuum atmosphere. The resultant melt 3 was kept at 1650° C., and He was introduced into the interior of the apparatus to provide a He atmosphere. The crucible 1 was then tilted so that the melt 3 dropped from the nozzle 4 onto the rotary disc 5 rotating at 20,000 r.p.m., while the He was ejected from the ejection ports 6, to form integrated particulate bodies of Cu-Nb.

The particulate bodies were then sieved to obtain a particulate bodies of a particle size in the range of 75 $\mu$m-125 $\mu$m. These integrated particulate bodies were molded by a press into a cylindrical body 4 cm in diameter and 6 cm long. The molded product was sintered in a vacuum atmosphere at 900° C. for 5 hours to form a Cu-Nb ingot for superconductive material according to the present invention.

The ingot was then processed to a diameter of 5 mm by fluted rollers, and then stretched into a wire 0.25 mm in diameter through a die. In this process, no breakage of the wire occurred, and the ingot proved to have a very high processability. The length of the elongated wire obtained was about 1.4 km. This elongated wire was plated with Sn to provide a coating of about 10 $\mu$m, and was then subjected to a preliminary heat treatment in a vacuum at 450° C. for 5 hours. The resultant elongated wire was subjected to a diffusion heat treatment at 600° C. for 48 hours to obtain a $Nb_3Sn$ superconductive wire. A total of 14 samples, each about 20 cm long, were cut from portions of this superconductive wire separated from one another by about 100 m. These samples were subjected to critical current measurements in a magnetic field 10 Tesla at a temperature of 4.2 K. As a result, it was ascertained that the critical current in all of the samples was within the range of 53A±5A, and that the samples were very homogeneous.

EXAMPLE 2

Particulate bodies of Cu containing 30% by weight V were produced by the same method as that in Example 1, using 700 gr of lumps of oxygen - free Cu and 300 gr of lumps of V. During this process, the temperature of the melt was kept at 1700° C., and the rotational speed of the rotary disc was set at 15,000 r.p.m. The particulate bodies were sieved to obtain 700 gr of integrated particulate bodies of a particle size of 100–150 μm. These particulate bodies were pressed to obtain a cylindrical molded product 4 cm in diameter and 5 cm long which was sintered in a vacuum at 900° C. for 5 hours to obtain a Cu-V ingot for superconductive material according to the present invention.

This ingot was then processed to a diameter of 5 mm by fluted rollers and then extended into a wire 2.6 mm in diameter through a die. The wire was rolled into a tape 5.1 mm wide and 0.1 mm thick. The processability of the ingot proved to be high, and a 150 m of elongated tape was obtained. This elongated tape was passed through a bath of molten Ga at 450° C. so that Ga was deposited thereon. The resultant tape was subjected to a diffusion heat treatment at 550° C. for 48 hours to produce a $V_3Ga$ superconductive tape. 15 samples about 20 cm long were cut from portions of the $V_3Ga$ superconductive tape about 10 m from one another. The critical currents in these samples were measured in a magnetic field of 10 Tesla at a temperature of 4.2 K. It was ascertained that the critical current of all of the samples was within the range of 670A±32A, and that they were very homogeneous.

As is clear from the above, the method of producing a material for superconductive material according to the present invention is very effective, i.e., the method according to the present invention is capable of preventing oxygen contamination of the Nb particles dispersed in the Cu base, and can provide a Cu-Nb or Cu-V superconductive material which has a high area-reduction processability and a high superconductivity. The method according to the present invention also enables the omission of complicated steps, such as the pretreatment and agitation-mixing of the raw powdered material, an improvement in the yield of the raw powdered material, and a large reduction in manufacturing cost.

What is claimed is:

1. A method of producing a material of which main components are Cu and one element selected from the group consisting of Nb and V and which is used for producing a superconductor, which comprises the steps of:
    melting, under vacuum, raw materials of Cu and one element from the group consisting of Nb and V at a predetermined ratio, to form a melt;
    scattering said melt to form a plurality of fine droplets; and
    cooling rapidly said scattering fine droplets to solidify them thereby providing integrated particulate bodies each of which includes particles of said one element dispersed in the Cu base.

2. The method as defined in claim 1, wherein said particulate bodies have substantially the same composition as the mixing ratio of said raw materials.

3. The method as defined in claim 1, wherein said scattering step is conducted by dropping said melt onto a rotating disc to subject said melt to centrifugal force, whereby said melt is scattered to form fine droplets.

4. The method as defined in claim 3, wherein said melt is dropped onto said rotating disc through a nozzle so that an amount of said melt dropping onto said rotating disc is well regulated.

5. The method as defined in claim 3, wherein said cooling step is conducted by spraying an inert gas onto said scattering fine droplets.

6. The method as defined in claim 3, further including the steps of:
    compression-molding said fine integrated particulate bodies to form a molded product of a predetermined shape; and
    sintering said molded product thereby providing an ingot in which particles of said one element are dispersed homogeneously in said Cu.

7. The method as defined in claim 6, further including a step of seiving said particulate bodies to obtain ones within a predetermined size range.

8. The method as defined in claim 7, wherein a ratio of an amount of said Cu and said one element in said ingot is substantially equal to said mixing ratio of said raw material.

9. The method as defined in claim 8, wherein said raw materials are melted at a temperature of 1400°–1800° C.

* * * * *